(12) United States Patent
Sanduleanu et al.

(10) Patent No.: US 8,198,945 B2
(45) Date of Patent: Jun. 12, 2012

(54) QUADRATURE OSCILLATOR WITH HIGH LINEARITY

(75) Inventors: Mihai A. T. Sanduleanu, Maastricht (NL); Eduard F. Stikvoort, Eindhoven (NL)

(73) Assignee: NXP B.V., Eindhoven (NL)

( * ) Notice: Subject to any disclaimer, the term of this patent is extended or adjusted under 35 U.S.C. 154(b) by 547 days.

(21) Appl. No.: 11/917,128

(22) PCT Filed: May 30, 2006

(86) PCT No.: PCT/IB2006/051717
§ 371 (c)(1),
(2), (4) Date: May 14, 2010

(87) PCT Pub. No.: WO2006/134506
PCT Pub. Date: Dec. 21, 2006

(65) Prior Publication Data
US 2010/0219896 A1   Sep. 2, 2010

(30) Foreign Application Priority Data

Jun. 13, 2005   (EP) ..................................... 05105153

(51) Int. Cl.
*H03B 27/00* (2006.01)
(52) U.S. Cl. .......................... 331/45; 331/117 R; 331/46
(58) Field of Classification Search .................... 331/34, 331/45, 46, 48, 55, 117 R, 117 FE, 117 D, 331/167, 175, 177 R
See application file for complete search history.

(56) References Cited

U.S. PATENT DOCUMENTS

| | | | |
|---|---|---|---|
| 5,917,383 A | 6/1999 | Tso et al. | |
| 6,188,292 B1* | 2/2001 | Liu | 331/45 |
| 6,404,293 B1 | 6/2002 | Darabi et al. | |
| 6,417,740 B1* | 7/2002 | Anh et al. | 331/48 |
| 6,650,195 B1 | 11/2003 | Brunn et al. | |
| 7,075,377 B2* | 7/2006 | Metaxakis | 331/46 |
| 7,146,140 B2* | 12/2006 | Ravi et al. | 455/146 |
| 7,342,462 B1* | 3/2008 | Chen | 331/45 |
| 2002/0093385 A1* | 7/2002 | Nishiyama et al. | 331/46 |
| 2004/0266380 A1* | 12/2004 | Ravi et al. | 455/205 |

FOREIGN PATENT DOCUMENTS

WO     03005560 A1   1/2003

* cited by examiner

*Primary Examiner* — Joseph Chang

(57) ABSTRACT

The present invention relates to an oscillator circuit and a method of controlling the oscillation frequency of an in-phase signal and a quadrature signal. First oscillator means (2) with a first differential oscillator circuit and a first differential coupling circuit are provided for generating the quadrature signal. Furthermore, second oscillator means (4) with a second differential oscillator circuit and a second differential coupling circuit are provided for generating the in-phase signal. A frequency control means is provided for varying the oscillation frequency of the in-phase signal and the quadrature signal by controlling at least one of a common-mode current and a tail current of the first and second oscillator means. Thereby, a high-frequency IQ oscillator with high linearity is obtained.

12 Claims, 9 Drawing Sheets

QUADRATURE OSCILLATOR WITH HIGH LINEARITY

The present invention relates to an oscillator circuit for generating an in-phase signal and a quadrature signal, and to a method of controlling oscillation frequency of the in-phase signal and the quadrature signal.

High-frequency voltage controlled oscillators (VCOs) are widely used in integrated circuits, ranging from clock recovery in high data-rate optical communications to frequency synthesizers in wireless communications. Frequency tuning for these VCOs can be achieved with varactor diodes.

IQ (in-phase/quadrature) oscillators are important building blocks for radio frequency (RF) transceivers. When quadrature signals are required, e.g. in IQ down-converters and in transmitter parts of data and clock recovery (DCR) units, few solutions apply. A conventional technique is based on a generation of signals at double frequency followed thereafter by frequency division by 2. However, this technique suffers from technology impairments and difficulty to obtain oscillators, dividers and buffers at double RF frequency. Another problem encountered at high frequency is the quality factor of the varactors and the associated parasitic capacitances, which diminish the effective tuning range. Ensuring tenability at this frequencies is a difficult task. Any solution based on varactors will suffer from these impairments.

Another possibility is to generate the quadrature signal from one-phase oscillators with polyphase filters or Weaver technique which uses subtraction and summing. However, at high frequency these solutions also do not apply. High frequency adders, subtractors, limiters and phase shifters are difficult to implement. A good π/2 phase shifter is difficult to implement at these frequencies and broadband adders and subtractors together with limiters are out of discussion due to the implementation difficulties. The same applies to polyphase filters if they are implemented as LC sections.

A possible solution is described for example in U.S. Pat. No. 6,188,292, where an IQ oscillator based on coupling is suggested. First and second fixed-frequency LC oscillators are coupled in ring topology to generate a variable frequency output. Frequency variation is achieved by varying the coupling between the two oscillators. The coupling may be varied by using a variable current or voltage source. This known IQ oscillator works well at low frequencies but fails working properly at higher frequencies of several GHz due to the large parasitic capacitance seen by the LC tank. In fact, the inductors will have two gate-source capacitance in parallel which limit proper operation for higher frequencies.

It is therefore an object of the present invention to provide an improved IQ oscillator circuit which does not require any varactors and is highly linear even at high frequencies.

This object is achieved by an oscillator circuit as claimed in claim 1 and by a method as claimed in claim 12.

Accordingly, the proposed solution is based on two substantially identical oscillator means or sections comprising a differential oscillator part and a differential coupling part. The variation of the oscillation frequency can be achieved by controlling the common-mode current and/or the tail currents of the oscillator and coupling parts. In particular, the tail currents can be controlled or changed differentially in the coupling and oscillator parts. In both cases, a linear tuning characteristic can be obtained. The oscillator thus requires no varactors and/or switched capacitors, so that total integration can be achieved for operation at very high frequencies.

The first and second differential oscillator circuits may each comprise a differential Colpitts type oscillator. These first and second differential Colpitts type oscillators may each comprise a first differential transistor stage as an under-stage for combining tail currents of a second differential transistor stage. Thus, only one noise source injecting noise in the LC tank is obtained, instead of two uncorrelated noise sources of conventional circuits with current generators in both branches of the differential Colpitts oscillator.

The differential coupling circuit may comprise a third differential transistor stage connected in parallel with the first differential transistor stage. Then, respective control terminals of the transistors of the second differential transistor stage may be connected at a bias point which forms a common mode point of the coils of a tank circuit of the first and second differential oscillator circuits. This bias point may be connected to a supply voltage via a common-mode resistor. This measure provides the advantage that the bias point has some rejection from the power supply and the oscillator is isolated from the supply due to the presence of the common-mode resistor and the coils.

The frequency control means may be configured to change differentially the tail currents of the first and second differential coupling circuits. In particular, the frequency control means may be configured to apply a tuning voltage via a tuning resistor to respective emitter terminals of transistors of the first and second differential coupling circuits. Such a differential tuning has several advantages, especially in a phase locked loop (PLL) configuration. For example, the first-order sensitivity towards common-mode signals and power supply variations can be reduced considerably.

Furthermore, the first and second differential coupling circuits may be connected to respective buffer circuits for connecting the first and second oscillator means. These buffer circuits may be driven by respective current sources which may generate a current of 1.5 times the value of the tail current of the first and second oscillator means.

Additionally, a phase conditioning circuit may be provided for connecting respective output terminals of the first and second oscillator means to provide phase matching. As a result, impairment of the phase quadrature relationship can be prevented.

Further advantageous modifications are defined in the dependent claims.

The present invention will now be described based on a preferred embodiment with reference to the accompanying drawings in which.

The preferred embodiment will now be described based on an IQ oscillator of the differential Colpitts type, which can be used e.g. in a transceiver circuit as described hereinafter.

Figure 1:
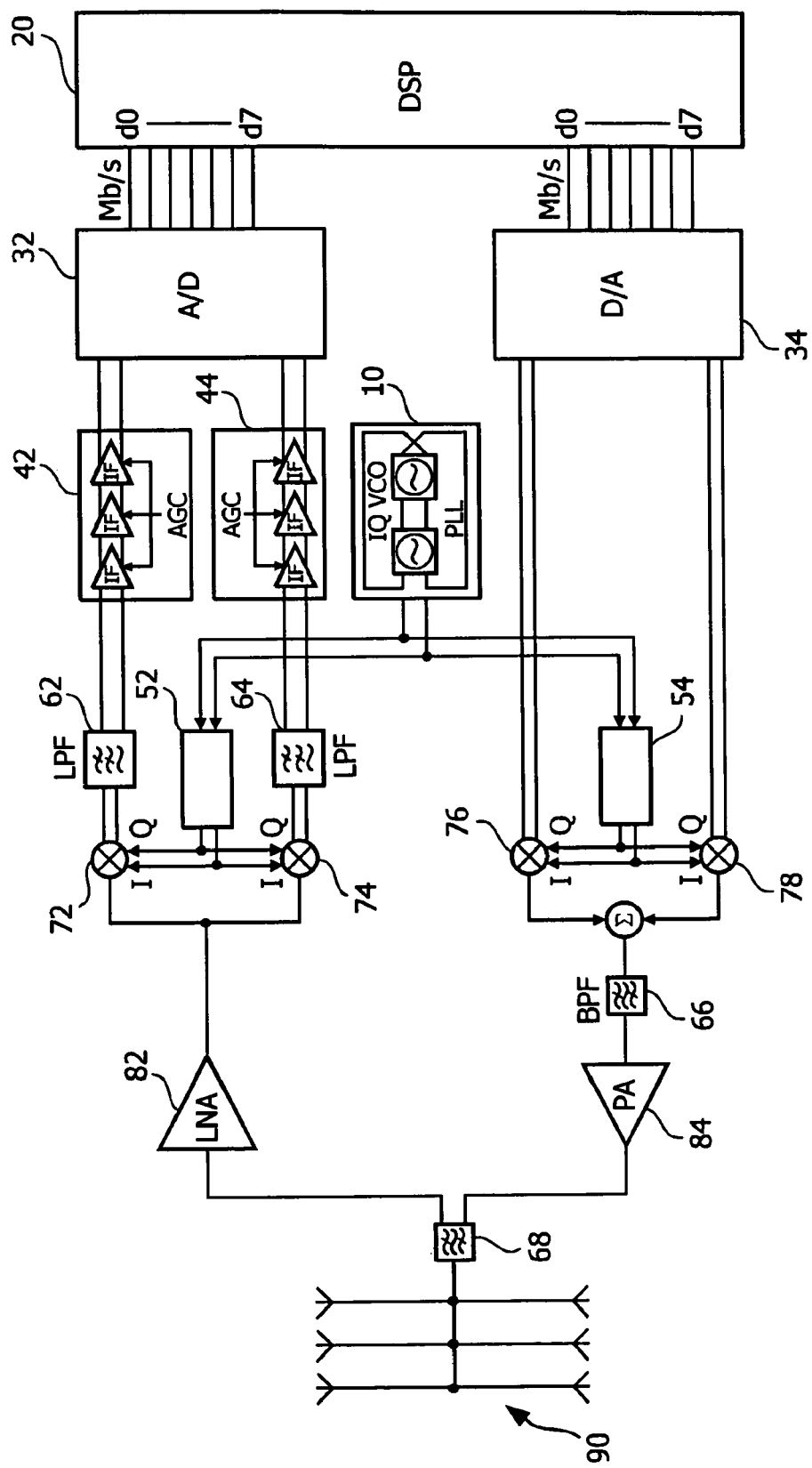
FIG. 1 shows a schematic block diagram of s transceiver circuit in which the oscillator circuit according to the preferred embodiment can be implemented.

FIG. 1 shows a transceiver circuit for wireless applications, such as WLAN (Wireless Local Area Network) or WPAN (Wireless Personal Area Network). This transceiver is a homodyne transceiver with a zero intermediate frequency (IF) both on the receiver side and on the transmitter side.

A signal or data stream received via an antenna array 90 is supplied via a matching filter 68 to a low noise amplifier (LNA) 82. The amplified output signal of the low-noise amplifier 82 is split into first and second branches each comprising a sub-harmonic mixer 72, 74, where the received signal is mixed with I and Q oscillation signals of an IQ VCO 10. The I and Q oscillation signals have been phase-adjusted at an IQ phase circuit 52. Respective low-pass filters 62, 64 and a down-converted output signal of the sub-harmonic mixers 72, 74 is supplied via respective automatic gain control (AGC) circuits 42, 44 to an analog-to-digital (A/D) converter 32 which converts the input signals into 8-bit data words supplied to a digital signal processor (DSP) 20 where the received signal is processed in accordance with the respective application, e.g. data application, radar application or the like.

On the transmission side, 8-bit transmission data generated at the DSP 20 is supplied in parallel to a digital-to-analog (D/A) converter 34 which converts the received parallel data into I and Q signals of two branches in order to be supplied to sub-harmonic mixers 76, 78, where they are up-converted by a mixing operation with the I and Q oscillation signals supplied from the IQ VCO 10 via an IQ phase circuit 54. The RF output signals of the sub-harmonic mixers 76, 78 are summed and supplied via a bandpass filter 66 to a power amplifier 84. The amplified transmission signal output from the power amplifier 84 is supplied via the matching filter 68 to the antenna array 90 for radio transmission.

The principle of the transceiver is based on the sub-harmonic mixers 72, 74, 76, 78 to which the I and Q signals are supplied at half-RF frequency from the IQ VCO 10. The operation at half the RF frequency leads to relaxed requirements for IQ matching and simplifies implementation of the oscillator. Another important feature of the zero-IF or homodyne receiver resides in the reduction of local oscillator leakage in the RF path and self-mixing of the local oscillator, i.e. IQ VCO 10.

On the transmitter side, benefits of using the sub-harmonic mixers 76, 78 and the half-RF VCO 10 are the impossibility of local oscillator pulling due to the power amplifier 84 and/or harmonics of the power amplifier operation frequency. Operating the IQ VCO 10 at half of the power amplifier frequency makes it impossible to pull the VCO frequency due to the strong power amplifier signals. Specifically for applications in FM radar techniques, a linear tuning characteristic of the IQ VCO 10 is required to achieve typical linearities in the order of 1.5%.

Figure 2:
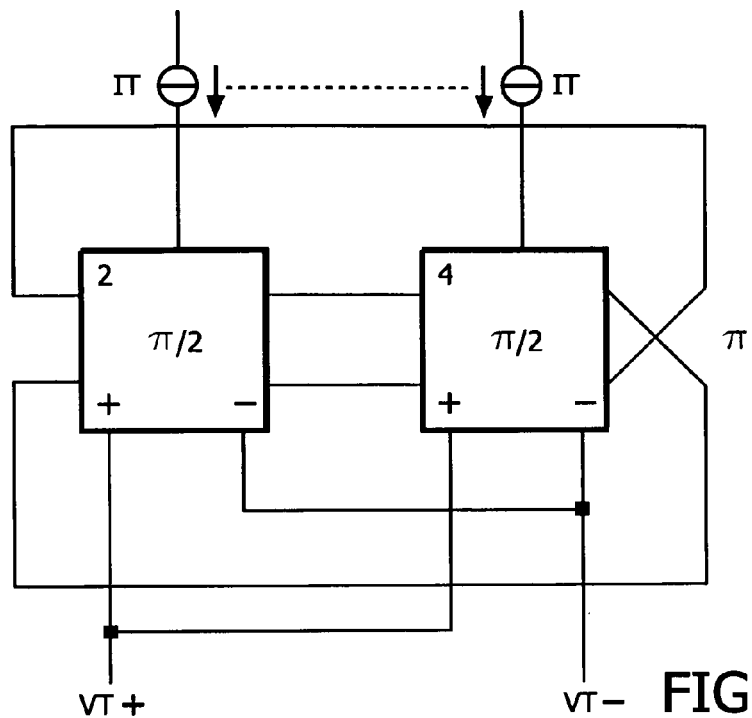
FIG. 2 shows a schematic block diagram of a coupled oscillator circuit.

FIG. 2 shows a schematic block diagram of a coupled IQ oscillator according to the preferred embodiment. The principle of this IQ oscillator is based on the coupling of two oscillator sections. The coupling between a first oscillator 2 and a second oscillator 4 is a direct coupling, while the coupling between the second oscillator 4 and the first oscillator 2 is a crossed coupling. According to the Barkhausen criteria, the total phase-shift within the loop must be equal to $2\pi$ (e.g. 360°). The crossed coupling introduces a phase-shift of $\pi$ (e.g.) 180°, so that the phase-shift introduced by the two oscillators 2, 4 must be equal to $\pi$ (e.g.) 180°. Thus, if the two oscillators 2 and 4 are identical, they should oscillate in quadrature. The oscillation frequency can be controlled by currents $I_T$ and/or in differential manner by a differential voltage $V_T$. The control of the common-mode or bias current $I_T$ can be used for coarse-tuning and the control by means of the differential voltage $V_T$ can be used for fine-tuning. The quadrature condition occurs when the transmission characteristics of both oscillators 2, 4 are identical. The oscillation condition provides two equi-propable or confounded solutions for the oscillation frequency if the frequency response of the oscillator circuits 2, 4 is symmetrical around its maximum.

Figure 3:
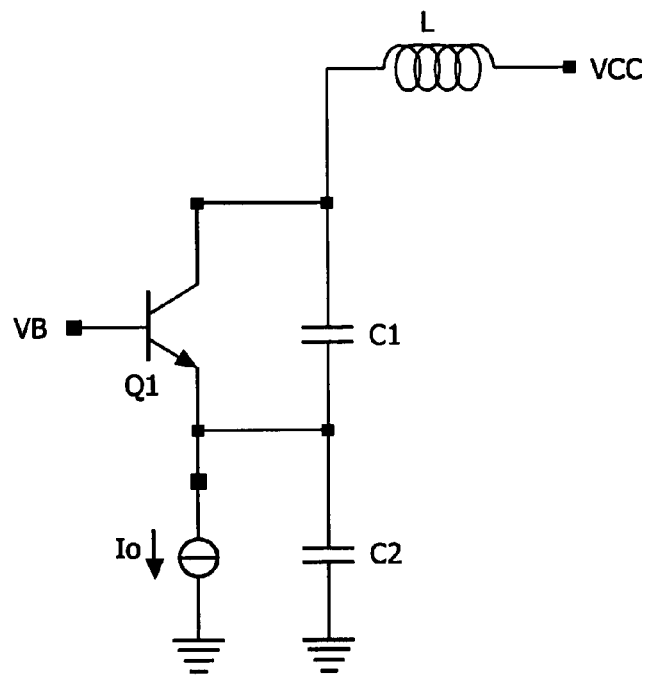
FIG. 3 shows a schematic circuit diagram of a Colpitts type oscillator.

FIG. 3 shows a schematic circuit diagram of a conventional Colpitts three-point oscillator, which forms the starting point of the preferred embodiment of the present invention. This type of oscillator has remarkable RF characteristics. First of all, the oscillator works in class C with current pulses. This means that a low bias voltage VB is applied at the gate of the transistor Q1, while the current injection into the LC tank happens at the instant when the voltage across the LC tank is at its maximum. The LC tank is constructed of a parallel circuit of the inductor L and a branch consisting of a series circuit of capacitances C1 and C2. The noise of a current source $I_0$ is injected into the LC tank when the circuit is insensitive to the noise, i.e. the output voltage gradient is zero at this moment in time. Another property of this oscillator configuration is the low parasitic capacitance in parallel with the coil of the inductor L. The largest capacitance of the bipolar transistor Q1 is the base-emitter capacitance which is not "seen" directly from the LC tank. When designed correctly, this Colpitts oscillator is less sensitive to process variations. The start-up condition and the oscillation frequency can be obtained based on the following equations:

$$g_m \geq G_p * \frac{C_2}{C_1} \quad (1)$$

$$\omega_c \cong \frac{1}{\sqrt{L * \frac{C_1 * C_2}{(C_1 + C_2)}}} \quad (2)$$

wherein $g_m$ designates the ratio between the collector current and the base-emitter voltage and $G_P$ designates the ratio between the collector-emitter voltage and the collector current.

A further advantage of this oscillator configuration resides from the start-up condition. When the ratio of the capacitors C2/C1 is larger than two, which is a condition easy to achieve, this oscillator needs less current than its balanced-oscillator counter parts for a safe start. In fact, a ratio C2/C1 of about 10 can be achieved in practice without extra penalties.

Figure 4:
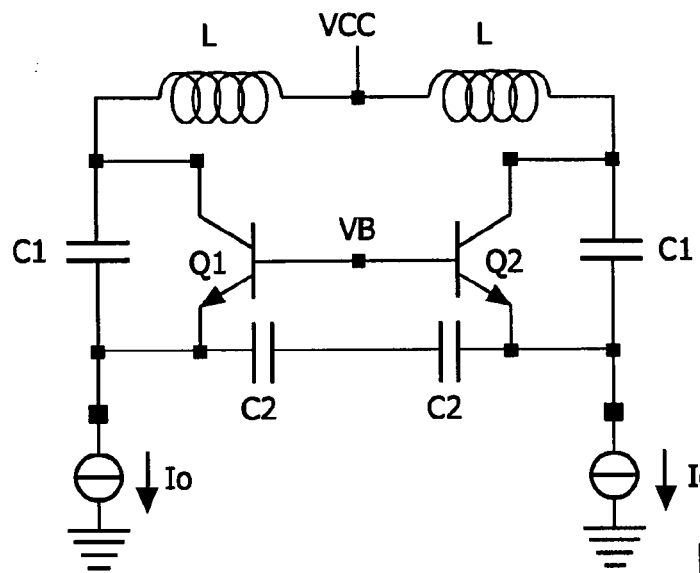
FIG. 4 shows a schematic circuit diagram of a differential Colpitts oscillator.

FIG. 4 shows a differential version of this Colpitts oscillator. Here, two Colpitts oscillator stages are connected in a differential circuit configuration having the base terminals of differential transistors Q1 and Q2 connected to each other, wherein a bias voltage VB is supplied to this common control point.

Figure 5:
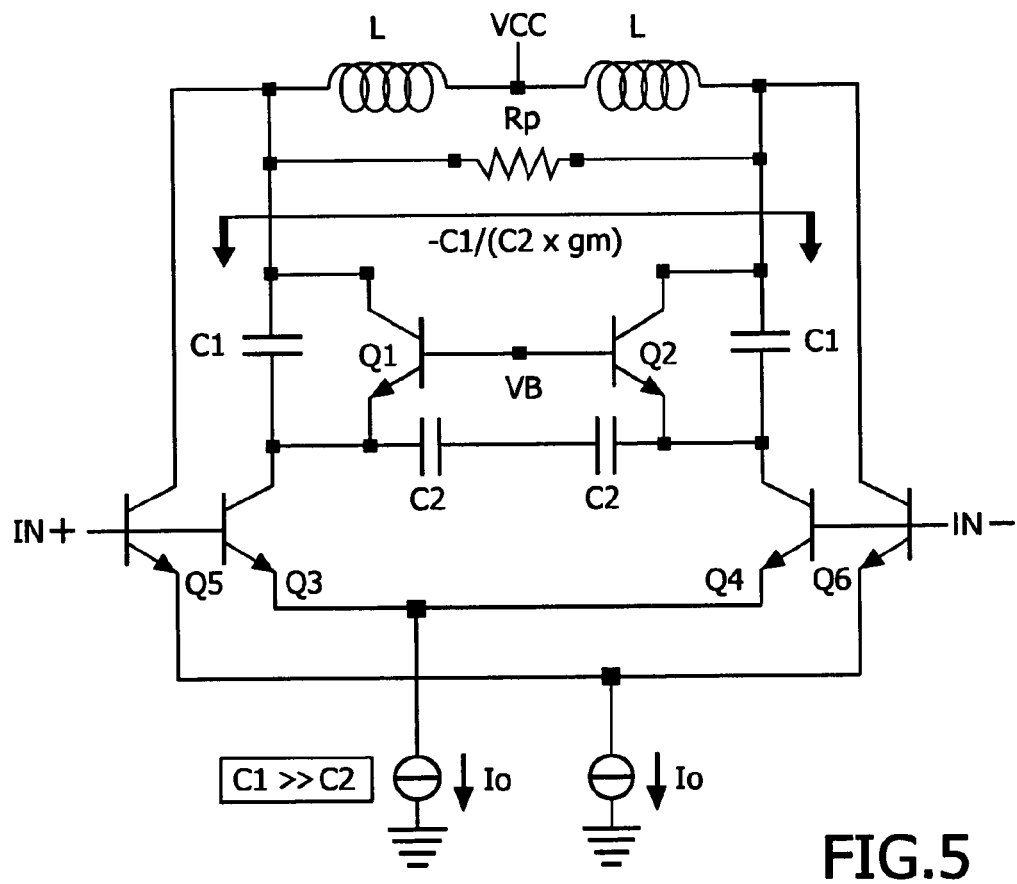
FIG. 5 shows a schematic circuit diagram of a differential Colpitts oscillator with a coupling part.

FIG. 5 shows an oscillator circuit with a Colpitts oscillator and a coupling part, as an implementation of the $\pi/2$ oscillator sections 2, 4 of FIG. 2. The Colpitts oscillator part which consists of the transistors Q1 and Q2 has an additional differential stage consisting of transistors Q3 and Q4 as an understage in order to provide only one noise source injecting noise into the LC tank and does not require two uncorrelated noise sources as indicated by the two current sources $I_0$ in each branch of FIG. 4. The coupling part is formed as an additional differential pair of transistors Q5 and Q6, in order to obtain a stage with a coupling factor of k which determines the coupling between the two oscillator stages 2, 4 of FIG. 2. The resistor $R_p$ of FIG. 5 represents the losses of the LC tank. Furthermore, as indicated in FIG. 5, the first capacitor C1 of the differential Colpitts oscillator is selected to have a much larger capacitance than the second capacitor C2.

The resulting parallel capacitance of that LC tank of the circuit shown in FIG. 5 has a capacitance value of C1/(C2·$g_m$). The differential input signal is applied between the terminals IN+ and IN−, while the differential output signal can be obtained at the collectors of the differential transistors Q1 and Q2 of the Colpitts oscillator.

Figure 6:
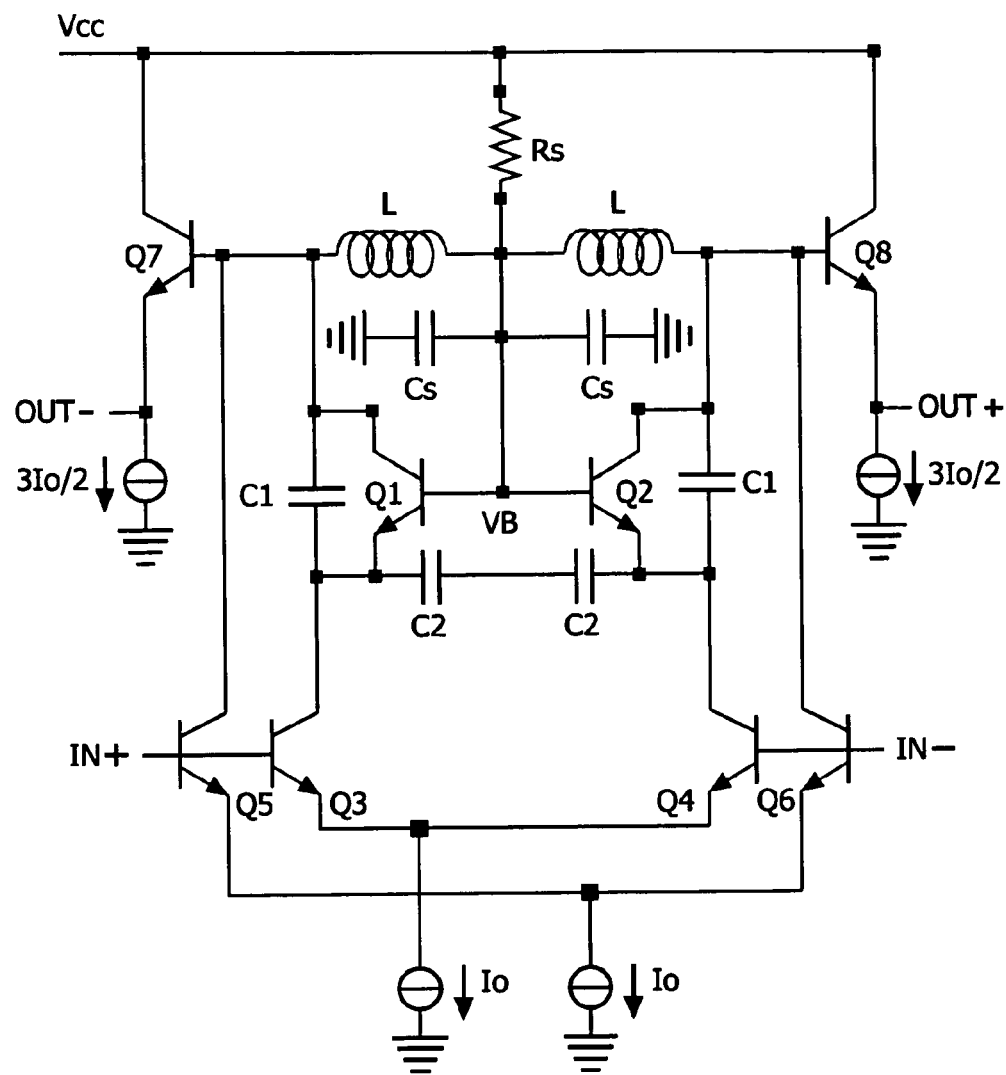
FIG. 6 shows a schematic circuit diagram of an implementation of a Colpitts oscillator and a coupling part.

FIG. 6 shows an implementation of the Colpitts oscillator with the differential coupling part according to the preferred embodiment.

A bias point at which the bias voltage VB is applied is generated from the common-mode point of the coils of the inductors L. Therefore, the bias point has some rejection from the power supply and the oscillator is isolated from the power supply due to the presence of the common-mode resistor $R_S$ and the coils of the inductors L.

Additionally, output buffer circuits are provided, which comprise transistors Q7 and Q8 connected in an emitter-follower circuit with a predetermined series resistor (not shown) of e.g. about 35 to 40Ω to generate a typical output impedance of e.g. 50Ω. The buffer circuit is driven by a current source which generates a current of e.g. 3 $I_0$/2.

The Colpitts frequency at is determined based on the above equation (1). However, when the LC tank or resonance circuit is lossy, the real oscillation frequency $\omega_0$ for a coupling factor k=0 differs from the Colpitts frequency as follows:

$$\omega_0 \cong \omega_C \sqrt{1 - \frac{g_m G_p L}{(C_1 + C_2)}} \quad (3)$$

Then, the two equidistant frequencies $\omega_{1,2}$ are determined by the following equation:

$$\omega_{1,2} \cong \omega_0 * \left[1 \pm \frac{G_p}{2}\sqrt{\frac{L(C_1+C_2)}{C_1 C_2}}\right] \quad (4)$$

additionally, decoupling capacitors Cs which are not shown in FIG. 5 are connected between the common control point or common-mode node and ground in order to filter any noise component of the supply voltage Vcc.

Figure 7:
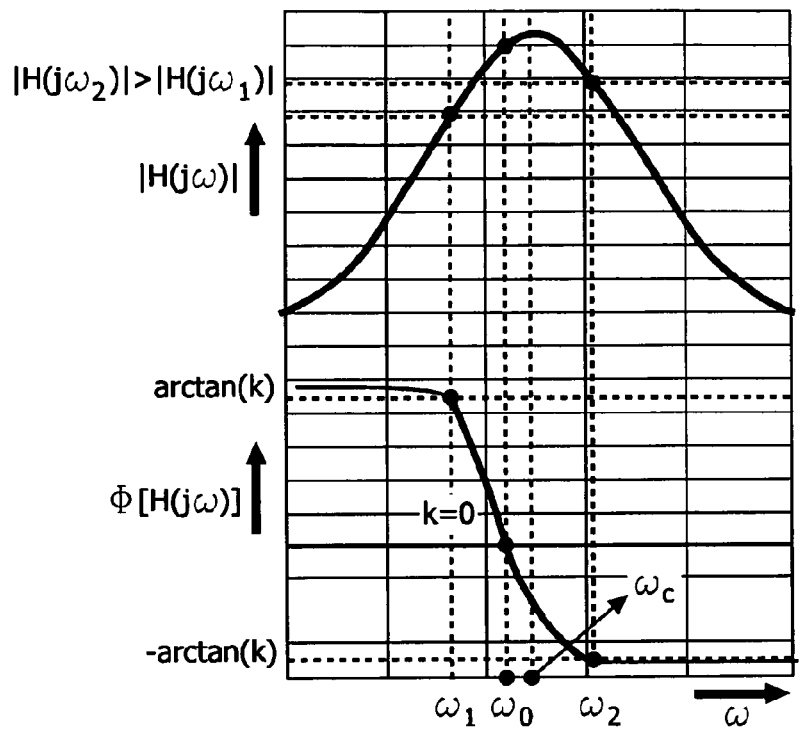
FIG. 7 shows a schematic diagram of the phase and amplitude transfer characteristics of an oscillator with a lossy tank in a high-frequency mode.

FIG. 7 shows frequency diagrams of the phase Φ and the absolute value of the complex transmission characteristic H(jω) of a lossy tank, where the oscillation condition is obtained in the high-frequency mode, i.e. oscillation frequency at $\omega_2$.

It is clear that the upper frequency $\omega_2$ is more probable to occur due to the larger signal amplitude on the loop at the upper frequency $\omega_2$. That is, the absolute value of the complex transmission characteristic H(jω) is higher at the upper frequency $\omega_2$ (H(j$\omega_2$)) than at the lower frequency $\omega_1$ (H(j$\omega_1$)).

This mode is called high-frequency mode. The usable region for tuning thus ranges between $\omega_0$ and $\omega_2$. By changing the coupling factor k, defined by the differential coupling part of FIGS. 5 and 6, the oscillation frequency of the oscillator circuit can be tuned as $\omega_{LO} \in (\omega_0, \omega_2)$. By changing the biasing conditions, controlled by the current source $I_0$, the differential oscillator can jump to a different mode of operation called low-frequency mode.

Figure 8:
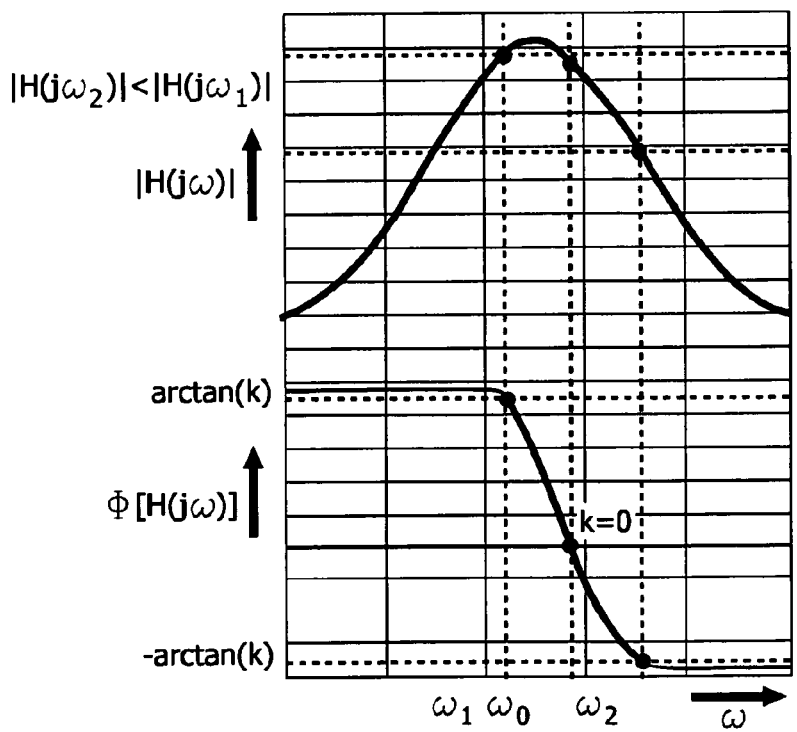
FIG. 8 shows a schematic diagram of the phase and amplitude transfer characteristics of an oscillator with a lossy tank in a low-frequency mode.

FIG. 8 shows the diagrams of the lossy tank where the oscillation condition is obtained in the low-frequency mode, i.e., oscillation frequency at $\omega_1$. Here, the oscillation frequency of the differential oscillator can be tuned as $\omega_{LO} \in (\omega_1, \omega_0)$. Therefore, the present differential oscillator shown in FIG. 6 can be operated in two different modes enabled by the bias current $I_0$.

Figure 9:
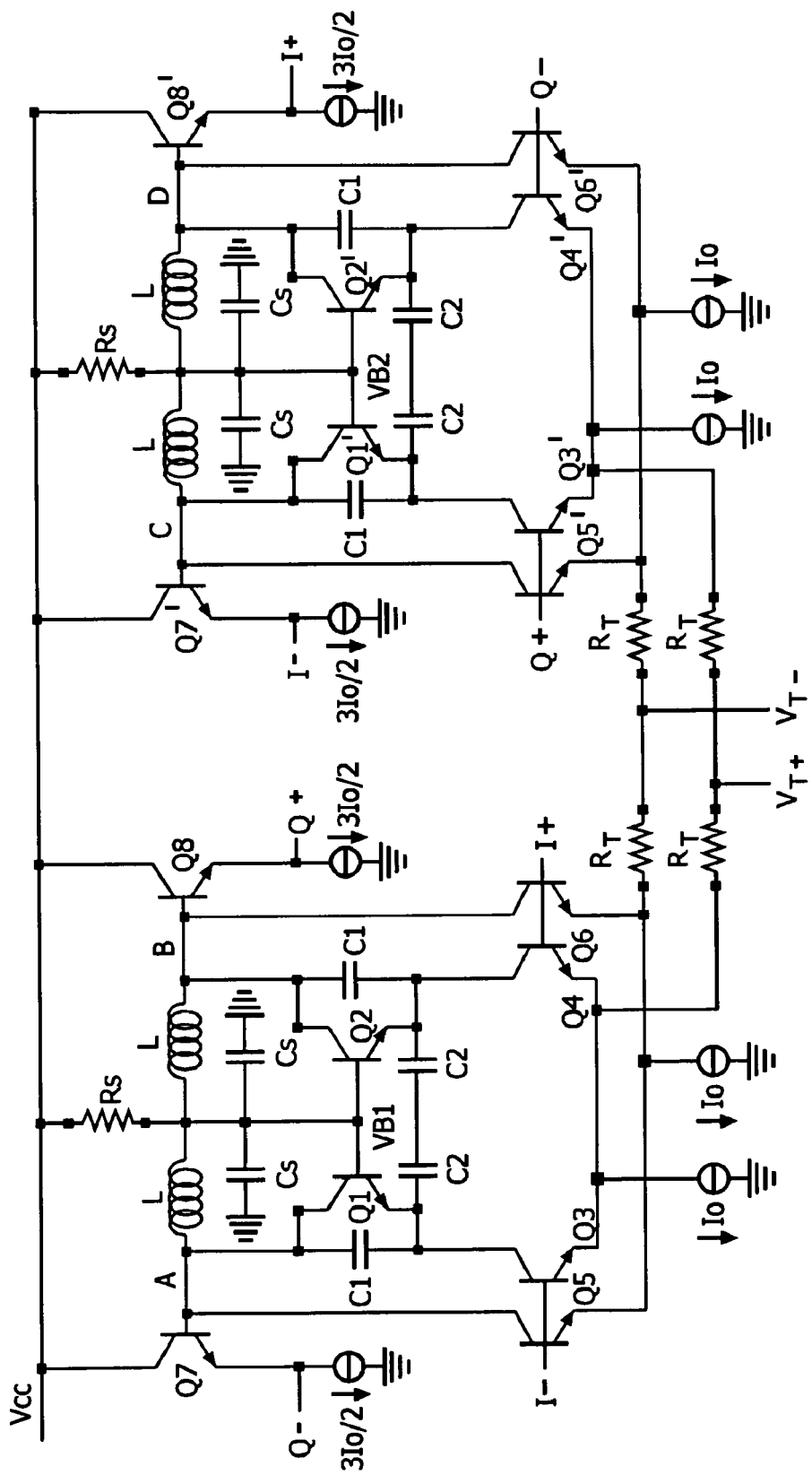
FIG. 9 shows a schematic circuit diagram of an implementation of the IQ oscillator circuit according to the preferred embodiment.

FIG. 9 shows a circuit diagram of an implementation of the whole differential IQ oscillator which consists of two differential oscillators with differential coupling circuits as shown in FIG. 6, and a tuning circuit comprising several tuning resistors $R_T$. The emitter follower circuits with transistors Q7, Q7', Q8 and Q8' give the required DC level shifting and buffer the voltage of the LC tanks. A useful way of control of these tail currents is shown in the circuit of FIG. 9. A positive voltage difference between VT+ and VT− (see FIG. 9) realizes a decrement of the tail currents of the pairs of Q3, Q4 and Q3', Q4' and increases the tail currents of the pairs of Q5, Q6 and Q5', Q6'.

By changing differentially the tuning voltage of $V_T$, the effective tail currents of the differential coupling parts and the differential Colpitts oscillators can be changed differentially. This control scheme can be used as a fine-tuning mechanism.

A VCO with such a differential tuning mechanism has the following specific advantages in a PLL configuration. First, the first-order sensitivity towards common-mode signals and power supply variations is reduced considerably. Second, noise injection is reduced and phase-noise properties are improved. Important noise contributors are the tail current sources $I_0$ which are not correlated, at least to some extent.

The signs "+" and "−" at the outputs of the buffer circuits and the inputs at the base terminals of the transistors of the differential coupling parts and the Colpitts oscillator parts denote the polarity of the respective output signals I and Q. These polarities reflect the circuit conditions of FIG. 2, so that the Barkhausen phase-shift criteria is met within the oscillator loop.

Figure 10:
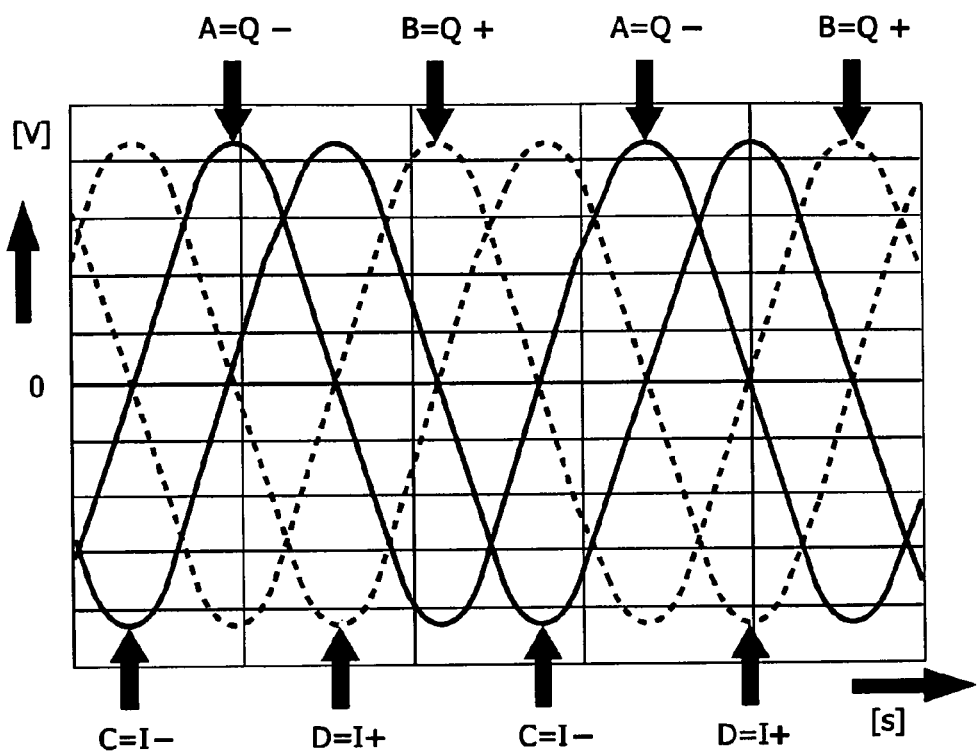
FIG. 10 shows a time diagram of the most important signals which occur in the circuit of FIG. 9.

FIG. 10 shows a diagram indicating the phases of signals A, B, C and D in FIG. 9. As can be gathered from FIG. 10, the phase of signal A corresponds to that of signal Q−, as the signals at the base and the emitter of the transistor Q7 are in phase. Similarly, the signal B corresponds to the signal Q+ at the transistor Q8. Furthermore, the signal C corresponds to the signal I− at the transistor Q7' and the signal D corresponds to the signal I+ at the transistor Q8'. Accordingly, as shown in FIG. 2, a phase shift of π/2 (90°) is provided between a differential outputs A, B of the first oscillator circuit on the left side of FIG. 9 and the differential outputs C, D of the second differential oscillator circuit on the right side of FIG. 9. Consequently, the oscillator on the left side of FIG. 9 generates the quadrature signal Q and the oscillator on the right side generates the in-phase signal I of the IQ oscillator.

The coupling part will lead to a noise injection in the LC tank (waveform of signal A) during the zero transitions of the other section (waveform of signal C). At this particular moment in time, the voltage on the LC tank (waveform of signal A) is however less sensitive towards external factors due to the zero time-gradient of the wave form (e.g. waveform of signal C). For the Colpitts oscillator section, the situation is comparable. The current pulses occur at the maximum value of the tank voltages. Based on this analysis, it can be concluded that the present differential IQ oscillator is less sensitive to noise injections resulting from the current sources $I_0$.

Furthermore, tunability and phase-noise are two parameters which compromise each other. The tunability phase-noise trade-off is common to every oscillator. When large tuning ranges are required, phase-noise properties are impaired. The present oscillator circuit can be operated in the Colpitts mode under the conditions set out in equations (1) and (2).

Figure 11:
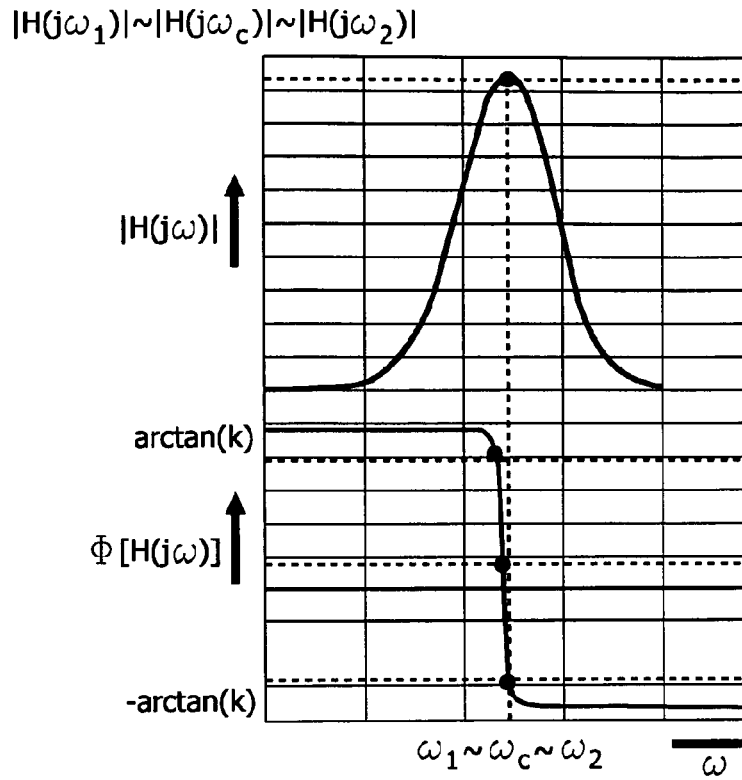
FIG. 11 shows a schematic frequency diagram of a Colpitts-Mode operation.

FIG. 11 shows frequency diagrams of absolute value and phase of the complex transmission characteristic for this situation. In this mode, total compensation of losses is achieved and the phase characteristic of the proposed VCO is very sharp around the Colpitts frequency cam. As a consequence, the two possible frequencies $\omega_1$ and $\omega_2$ are confounded and the oscillator shows very good phase-noise properties.

However, I/Q amplitude and phase matching is important for the performance of the down-conversion system. Although the output buffer circuits of the proposed IQ VCO shown in FIG. 9 will enforce equal amplitudes, the phase quadrature relationship may still be impaired. To improve I/Q matching, an IQ conditioner can be applied as a circuit for assuring the phase quadrature relationship.

Figure 12:
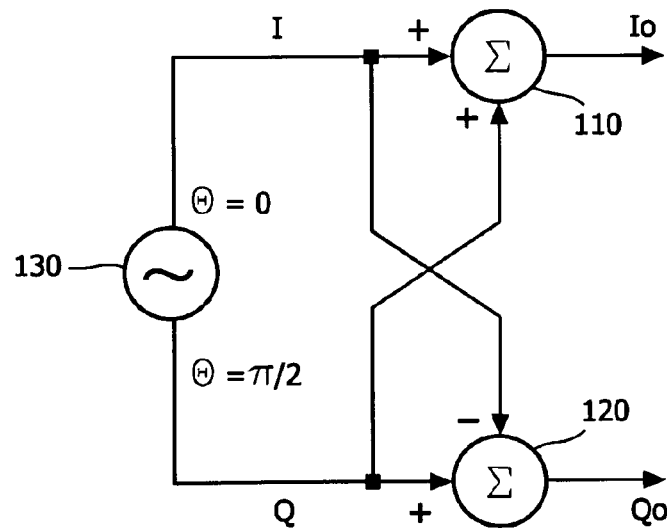
FIG. 12 shows a schematic functional diagram of an IQ conditioner.

FIG. 12 shows a schematic functional diagram of such an IQ conditioner. The two almost quadrature outputs I, Q obtained from the IO oscillator 130 are added at an adder 110 and subtracted at a subtractor 120 to generate two new outputs $I_0$ and $Q_0$.

Assuming a phase difference 9 between the quadrature outputs of the IQ VCO 130, the signals I and Q can be expressed as follows:

$$I(t) = A \cos(\omega_0 t)$$

$$Q(t) = A \cos(\omega_0 t + \phi) \quad (5)$$

In this case, the addition and subtraction in the adder 110 and subtractor 120 of FIG. 12 leads to the following expression of the signals $I_0$ and $Q_0$:

$$I_0(t) = 2A\cos\left(\frac{\varphi}{2}\right)\cos\left(\omega_0 t + \frac{\varphi}{2}\right) \quad (6)$$

$$Q_0(t) = 2A\sin\left(\frac{\varphi}{2}\right)\sin\left(\omega_0 t + \frac{\varphi}{2}\right)$$

These equations are obtained by trigonometric theorems formulas for addition. As can be gathered from the equations (6), for small phase errors, the amplitudes of the two outputs $I_0$ and $Q_0$ are both equal to $\sqrt{2} \cdot A$. The phase difference between the new outputs $I_0$ and $Q_0$ is $\pi/2$ and the phase error is zero as long as the adder 110 and the subtractor 120 do not add any amplitude and phase errors.

Implementation of the IQ conditioner for frequency ranges above 30 GHz is difficult unless passive components are used for addition and subtraction.

Figure 13:
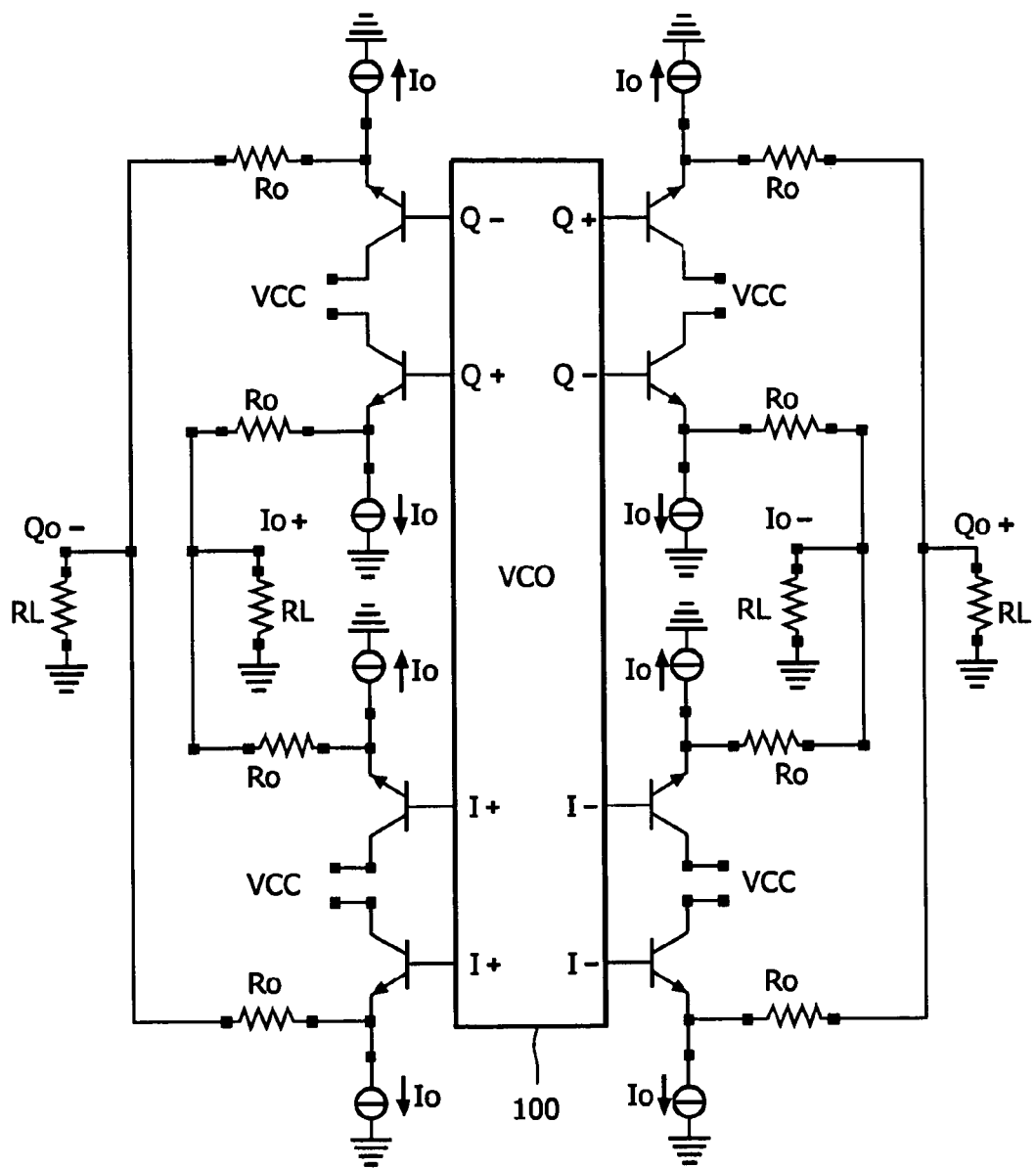
FIG. 13 shows a schematic circuit implementation of the IQ conditioner according to the preferred embodiment.

FIG. 13 shows a schematic circuit diagram of a circuit level implementation of the IQ conditioner of FIG. 14. The circuit principle is based on emitter-follower circuits with series resistors $R_0$. The existence of differential outputs for the I and Q signals of the IQ VCO 100 simplifies the addition and subtraction. As can be gathered from FIG. 13, the positive output of $Q_0$ is obtained by adding the positive output Q+ and the negative output I−, while the negative output of $Q_0$ is obtained by adding the negative output Q− and the positive output I+. Similarly, the positive output of $I_0$ is obtained by adding the positive output Q+ and the positive output I+, while the negative output of $I_0$ is obtained by adding the negative output Q− and the negative output I−. Thus, the new output $I_0$ is obtained by adding the differential signals I and Q, while the new output $Q_0$ is obtained by subtracting the differential signals I from the differential signals Q.

The proposed IQ VCO can be realized in a BiCMOS process, such as QUBIC4, with a top metal layer for the inductors. Thereby, a linear current-tuning characteristic can be obtained where the oscillation frequency shows a linear dependency from the bias current $I_0$. As an example, the frequency can be varied from 23 GHz to 24.4 GHz if the bias current $I_0$ is changed from 1 mA to 2.25 mA.

Additionally, a differential tuning characteristic is obtained which depends on the value of the tuning voltage $V_T$. The slope of this voltage-tuning characteristic can be controlled by changing the value of the tuning resistor $R_T$. Thus, the tuning resistor $R_T$ may be a fixed on-chip resistor or a variable on-chip or external resistor. The linearity of the voltage-tuning characteristic can be improved by proper selection of the tuning resistor $R_T$.

In conclusion, a varactor-less IQ oscillator with high linearity and differential tuning mechanism has been presented. It is based on two substantially identical oscillator sections comprising a differential Colpitts part and a differential coupling part. The variation of the oscillator frequency can be achieved by tuning the common-mode current and/or by changing tail currents of the coupling and Colpitts parts. This change may be a differential change. The result is in both cases a linear tuning characteristic. The IQ oscillator can be implemented in any transceiver circuit for radar, mobile, unlicensed frequency bands or the like.

It is however noted that the first and second oscillator means may be any kind of differential oscillator circuit. Furthermore, any suitable frequency control means may be used for varying the oscillation frequency of the output signals I and Q by controlling at least one of the common-mode current $I_0$ and the tail currents of the oscillator and coupling circuits. The preferred embodiment may thus vary within the scope of the attached claims.

Finally, it is noted that the term "comprises" or "comprising" when used in the specification including the claims is intended to specify the presence of stated features, means, steps or components, but does not exclude the presence or addition of one or more other features, means, steps, components or group thereof. Further, the word "a" or "an" preceding an element in a claim does not exclude the presence of a plurality of such elements. Moreover, any reference sign does not limit the scope of the claims.

The invention claimed is:

1. An oscillator circuit for generating an in-phase signal and a quadrature signal, said oscillator circuit comprising:
    a) first oscillator means comprising a first differential oscillator circuit and a first differential coupling circuit, for generating said quadrature signal;
    b) second oscillator means comprising a second differential oscillator circuit and a second differential coupling circuit, for generating said in-phase signal; and
    c) frequency control means for varying the oscillation frequency of said in-phase signal and said quadrature signal by controlling at least one of a common-mode current and a tail current of said first and second oscillator means,
       wherein said first and second differential oscillator circuits each comprise a differential Colpitts type oscillator, wherein said first and second differential Colpitts type oscillators each comprise a first differential transistor stage as an under-stage for combining tail currents of a second differential transistor stage, wherein respective control terminals of the transistors of said second differential transistor stage are connected at a bias point which forms a common-mode point of coils of a tank circuit of said first and second differential oscillator circuits.

2. An oscillator circuit according to claim 1, wherein said differential coupling circuit comprises a third differential transistor stage connected in parallel with said first differential transistor stage.

3. An oscillator circuit according to claim 1, wherein said bias point is connected to a supply voltage via a common-mode resistor.

4. An oscillator circuit according to claim 1, wherein said frequency control means are configured to change differentially tail currents of said first and second differential coupling circuits.

5. An oscillator circuit according to claim 4, wherein said frequency control means are configured to apply a tuning voltage via a tuning resistor to respective emitter terminals of transistors of said first and second differential coupling circuits.

6. An oscillator circuit according to claim 1, wherein said first and second differential coupling circuits are connected to respective buffer circuits for connecting said first oscillator means to said second oscillator means.

7. An oscillator circuit according to claim 6, wherein said buffer circuits are driven by respective current sources which generate a current of 1.5 times the value of said tail current of said first and second oscillator means.

8. An oscillator circuit according to claim 1, further comprising a phase conditioning circuit for connecting respective output terminals of said first and second oscillator means to provide phase matching.

9. A method of controlling an oscillation frequency of an in-phase signal and a quadrature signal, said method comprising the steps of:
 a) generating said quadrature signal by a first differential oscillator circuit;
 b) generating said in-phase signal by a second differential oscillator circuit;
 c) connecting said first differential oscillator circuit to said second differential oscillator circuit via respective differential coupling circuits; and
 d) controlling at least one of a common-mode current and a tail current of said first and second differential oscillator circuits and said first and second differential coupling circuits, so as to vary said oscillation frequency, wherein the controlling at least one of the common-mode current and the tail current of said first and second differential oscillator circuits and said first and second differential coupling circuits includes changing differentially tail currents of said first and second differential coupling circuits.

10. The oscillator circuit of claim 1, wherein the respective control terminals of the transistors of said second differential transistor stage are gate terminals of the transistors of said second differential transistor stage.

11. An oscillator circuit for generating an in-phase signal and a quadrature signal, said oscillator circuit comprising:
 a) first oscillator means comprising a first differential oscillator circuit and a first differential coupling circuit, for generating said quadrature signal;
 b) second oscillator means comprising a second differential oscillator circuit and a second differential coupling circuit, for generating said in-phase signal; and
 c) frequency control means for varying the oscillation frequency of said in-phase signal and said quadrature signal by controlling at least one of a common-mode current and a tail current of said first and second oscillator means, wherein said frequency control means are configured to change differentially tail currents of said first and second differential coupling circuits.

12. The oscillator circuit of claim 11, wherein said frequency control means are configured to apply a tuning voltage via a tuning resistor to respective emitter terminals of transistors of said first and second differential coupling circuits.

* * * * *